United States Patent
Ravi et al.

(10) Patent No.: US 6,639,481 B1
(45) Date of Patent: Oct. 28, 2003

(54) TRANSFORMER COUPLED QUADRATURE TUNED OSCILLATOR

(75) Inventors: Ashoke Ravi, Hillsboro, OR (US); Krishnamurthy Soumyanath, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/224,684

(22) Filed: Aug. 20, 2002

(51) Int. Cl.[7] .................................................. H03L 7/00
(52) U.S. Cl. ..................................................... 331/177 V
(58) Field of Search ............................. 331/36 R, 36 C, 331/46, 177 V

(56) References Cited

U.S. PATENT DOCUMENTS 5,912,596 A * 6/1999 Ghoshal .................. 331/117 R
6,456,167 B1 * 9/2002 Huang .......................... 331/46

* cited by examiner

*Primary Examiner*—Jeffrey Zweizig
(74) *Attorney, Agent, or Firm*—Blakely, Sokoloff, Taylor & Zafman LLP

(57) ABSTRACT

First and second oscillator cells include tank circuits that may be tuned to a desired resonant frequency using varactors as variable reactance devices in a phase-shifting network. First and second transformers are connected to the oscillator cells to control the varactors.

20 Claims, 2 Drawing Sheets

TRANSFORMER COUPLED QUADRATURE TUNED OSCILLATOR

Radio Frequency (RF) transceivers typically use some form quadrature modulation to achieve higher spectral efficiency. The two most common transceiver architectures are the direct conversion and heterodyne conversion receivers. A direct conversion receiver requires the Radio Frequency Local Oscillator (RFLO) to generate two output signals, referred to as the in-phase and quadrature carriers, whose relative phases are ninety degrees apart. In applications using a heterodyne receiver, an Intermediate Frequency Local Oscillator (IFLO) generates two signals whose relative phases are ninety degrees apart. However, one limitation of the heterodyne receiver architecture is a need for a significant amount of attenuation at the "image frequency" in the front-end filter and the Low Noise Amplifier (LNA). The amount of attenuation of the "image frequency" is called the image rejection ratio of the filter.

A modification of the heterodyne architecture called the Weaver architecture is commonly used in an integrated receiver to achieve additional image rejection. This architecture requires both the local oscillator at radio frequencies as well as that at intermediate frequencies to generate two signals each whose relative phases are ninety degrees apart.

It would be advantageous to have a circuit that generates two, high spectral purity, local oscillator carriers with a relative phase shift of ninety degrees that may be used in the modulation and demodulation process. It would be of further advantage for the circuit to be area and cost efficient.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
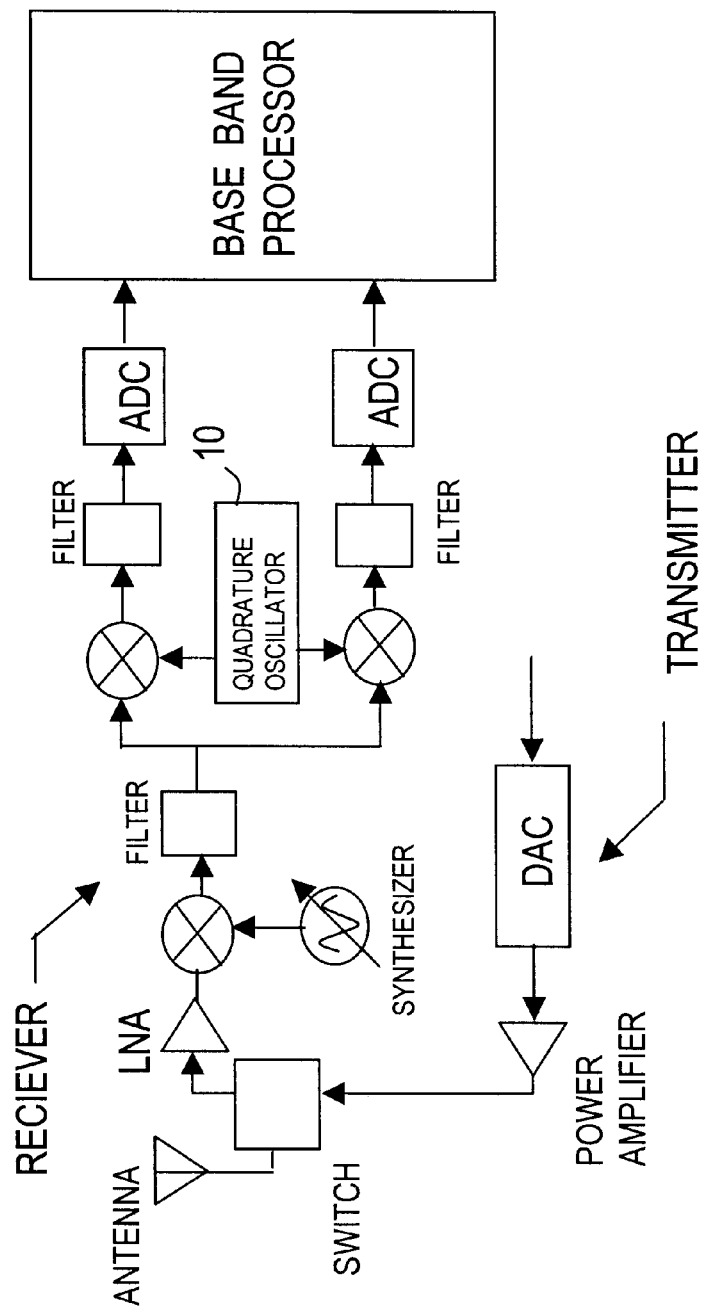
FIG. 1 is a block diagram that illustrates a transceiver for an electronic component having a transformer-coupled quadrature oscillator in accordance with the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Embodiments of the present invention may be used in a variety of applications. The circuits disclosed herein may have applications for wireless communication and be found in analog and mixed signal circuits, integrated with general-purpose core processors, and used with microcontrollers, Digital Signal Processors (DSPs), Reduced Instruction-Set Computing (RISC), Complex Instruction-Set Computing (CISC), among other electronic components. The present invention may be incorporated into next generation smart phones, communicators and Personal Digital Assistants (PDAs), base band and application processors, platform OS based devices, digital cameras, audio & video decoding, automotive infotainment, set top box and other products.

In the following description and claims, the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

FIG. 1 is a block diagram that illustrates a transceiver for an electronic component having a transformer-coupled quadrature oscillator 10 in accordance with the present invention. The transceiver has a receiver portion and a transmitter portion with a switch or duplexer that isolates signals, permitting one or more common antenna to receive and output a modulated Radio Frequency (RF) signal. Typically, the receiver may use a Low Noise Amplifier (LNA) to amplify the received modulated RF signal and a mixer to multiply the amplified signal with a synthesizer generated unmodulated pure tone signal. Thus, the spectrum of a received modulated RF signal may be translated to provide modulated Intermediate Frequency (IF) signals, that may be further translated to base band frequencies using the present invention for a transformer-coupled quadrature oscillator 10.

Figure 2:
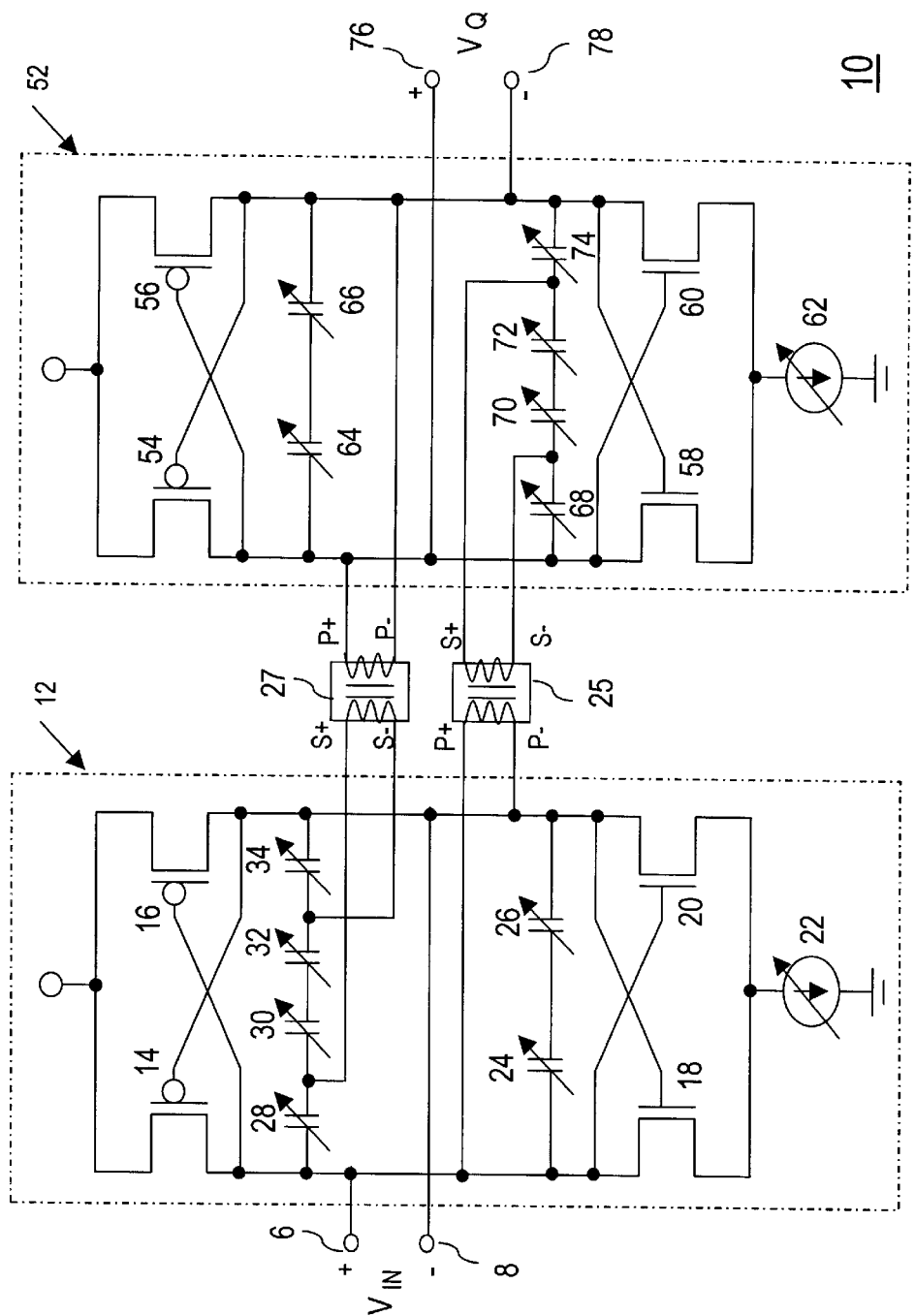
FIG. 2 is a schematic diagram of the transformer-coupled quadrature oscillator illustrated in FIG. 1.

FIG. 2 is a schematic diagram that illustrates the components of the transformer-coupled quadrature oscillator 10 shown in FIG. 1. Quadrature oscillator 10 includes oscillator cells 12 and 52. Oscillator cell 12 generates a differential signal $V_{IN}$ as an in-phase component one of the output signals of oscillator 10, the differential signal being coupled via a transformer 25 as a feedback signal to oscillator cell 52. Oscillator cell 52 generates a differential signal $V_Q$ as one of the output signals of oscillator 10, the differential signal being coupled via a transformer 27 as a feedback signal to oscillator cell 12.

In particular, oscillator cell 12 includes N-channel cross-coupled transistors 18 and 20 and P-channel cross-coupled transistors 14 and 16. By nature of being cross-coupled, the drain of transistor 18 is connected to the gate of transistor 20, while the drain of transistor 20 is connected to the gate of transistor 18, with the commonly connected source terminals of the two transistors coupled through a current source 22 to a power conductor that may receive a ground reference. The drain of transistor 14 is connected to the gate of transistor 16, while the drain of transistor 16 is connected to the gate of transistor 14, with the commonly connected source terminals of these two transistors connected to a power conductor that may receive a positive potential. The in-phase output signal $V_{IN}$ is generated differentially at the commonly connected drains of transistors 14 and 18 (node 6) and the commonly connected drains of transistors 16 and 20 (node 8).

Oscillator cell 12 includes a tank circuit that may be tuned to a desired resonant frequency using varactor diodes as variable reactance devices. Varactors 24 and 26 form a set of serially connected reactance devices and varactors 28, 30, 32 and 34 form another set of serially connected reactance devices, with both sets connected between terminals 6 and 8. The reactance devices, i.e., the inductors and varactors, form a phase shift network with in-phase components ($V_{IN}$) generated at nodes 6 and 8 and quadrature components ($V_Q$) generated at nodes 76 and 78 at resonance.

Oscillator cell 52 also includes cross-coupled N-channel transistors 58 and 60 and P-channel transistors 54 and 56. Cross-coupled transistor 58 has a drain connected to the gate of transistor 60, while the drain of transistor 60 is connected to the gate of transistor 58, with the commonly connected source terminals of these two transistors coupled through a current source 62 to the power conductor that receives the ground reference. The drain of transistor 54 is connected to the gate of transistor 56, while the drain of transistor 56 is connected to the gate of transistor 54, with the commonly connected source terminals of these two transistors connected to the power conductor that receives the positive potential. The output signal $V_Q$ is generated differentially at the commonly connected drains of transistors 54 and 58 (node 76) and the commonly connected drains of transistors 56 and 60 (node 78).

Oscillator cell 52 also includes a tank circuit that may be tuned to a desired resonant frequency using variable reactance devices such as, for example, varactor diodes. Varactors 64 and 66 form a set of serially connected reactance devices and varactors 68, 70, 72 and 74 form another set of serially connected reactance devices, with both sets connected between terminals 76 and 78. The reactance devices, i.e., the inductors and varactors, form a phase shift network with in-phase components ($V_{IN}$) generated at nodes 6 and 8 and quadrature components ($V_Q$) generated at nodes 76 and 78 at resonance.

In one embodiment, transformers 25 and 27 are on-chip transformers used to provide coupling between oscillator cells 12 and 52. Transformer 27 has primary windings connected to output terminals 76 and 78 of oscillator cell 52 for receiving the differential signal $V_Q$, with one secondary winding connected to varactors 28 and 30 and another secondary winding connected to varactors 32 and 34 of oscillator cell 12. Transformer 25 has primary windings connected across output terminals 6 and 8 of oscillator cell 12 that generates the differential signal $V_{IN}$, with one secondary winding connected to varactors 68 and 70 and another secondary winding connected to varactors 72 and 74 of oscillator cell 52. Oscillator cells 12 and 52 generate signals $V_{IN}$ and $V_Q$ respectively having oscillations that are in quadrature to one another.

Transformers 25 and 27 may be referred to as on-chip planar transformers that are fabricated on a semiconductor die. Transformers with a high-Q factor are desirable, since this translates to improvement in the Signal-to-Noise (S/N) ratio and to a low resistive loss in the spiral coil. Low resistive loss in a transformer is desirable when used in low voltage circuitry because there is minimal voltage drop across the transformer, allowing the signal to pass through the transformer with minimal loss in power and distortion. Ideally, transformers are reactive devices that do not produce a physical load on the coupled circuit.

In operation, the structure of the tank circuit illustrated in FIG. 2 for transformer-coupled quadrature oscillator 10 allows the appropriate signals from the two resonant tanks with the same phases to be combined. Note that the oscillator tank circuit in oscillator 12 produces an in-phase signal $V_{IN}$ at nodes 6 and 8 and that the signal on the secondary port of transformer 27 is ninety degrees shifted with respect to the in-phase signal $V_{IN}$. Further note that the oscillator tank circuit in oscillator 52 produces a quadrature signal $V_Q$ at nodes 76 and 78 and this quadrature signal is phase shifted by ninety degrees from the in-phase signal $V_{IN}$. The signal on the secondary port of transformer 25 is ninety degrees shifted with respect to the quadrature signal $V_Q$, and therefore, is anti-phase or shifted 180 degrees when compared to the in-phase signal $V_{IN}$.

Accordingly, the primary and secondary ports of transformer 25 are connected to change the 180 degrees to 0 degrees in order to combine signals that have the same phase.

When the primary and secondary ports of the transformers have the same winding sense and the currents in the two ports are in phase, then the equivalent inductance at the input to each port is increased by a factor of (1+M), where M is the magnetic coupling between the two coils. With the primary and secondary coils of on-chip transformers 25 and 27 fabricated having a close proximity to one another, the result is a high degree of magnetic coupling. The increased magnetic coupling enhances the mutual inductance at the primary and secondary ports of transformers 25 and 27. The phase shift network provided by the varactors, along with the mutual inductance coupling between the primary and secondary turns of transformers 25 and 27 allows for optimal, i.e., in-phase coupling, leading to an improvement in the quality-factor of the resonant tank.

The use of transformers 25 and 27 to increase the equivalent inductance at the ports of these transformers provides design trade-offs, allowing smaller geometry transformers, and thereby, reducing the silicon area needed for quadrature oscillator 10. It should be noted that high Q-factor on-chip transformers may be integrated by incorporating multiple stacked metal layers and a grid of polymaterial under the metal layers. In accordance with the circuit architecture, the in-phase currents in the primary and secondary ports of transformers 25 and 27, a consequence of the varactors used in the phase-shift network, provide a lower parasitic shorting capacitance between the transformer windings. the lower capacitance leads to a higher self-resonant frequency of transformers 25 and 27, and therefore, enables high frequency operation of quadrature oscillator 10. By way of example, quadrature oscillator 10 produces precise, low phase-noise quadrature signals usable for multiple frequency bands, having applications in the 2.4 GHz to 5.2 GHz range and extensible to the 24 GHz band, although this frequency range is not limiting. In other words, quadrature oscillator 10 may be integrated into products having operating frequencies outside this range.

The phase shift network that includes the varactors introduces a phase shift that is continuously adjustable to produce the quadrature output signal $V_Q$. It is desired that the quadrature output signal has ninety degrees of phase shift relative to the in-phase signal $V_{IN}$. If the phase of the quadrature signal $V_Q$ deviates from quadrature with respect to the input signal $V_{IN}$, the feedback signals provided by transformers 25 and 27 adjusts the phases of the two signals to restore quadrature. It should be noted that oscillator cells 12 and 52, as well as transformers 25 and 27, have a frequency response capable of producing the quadrature output signal over the operating frequency range of wireless communications devices in broadband applications and operate over a wide megahertz frequency range.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus comprising:

first and second oscillator circuits, the first oscillator circuit having output terminals coupled to provide an in-phase signal and the second oscillator circuit having output terminals to provide a quadrature signal; and first and second transformers, the first transformer having primary windings to couple the in-phase signal to the second oscillator circuit and the second transformer having primary windings to couple the quadrature signal to the first oscillator circuit.

2. The apparatus of claim 1 further including a first phase shift network of variable reactance devices connected between the output terminals of the first oscillator circuit.

3. The apparatus of claim 2 wherein the first phase shift network includes at least four serially connected varactors.

4. The apparatus of claim 3 further including a second phase shift network of variable reactance devices connected between the output terminals of the second oscillator circuit.

5. The apparatus of claim 4 wherein the second phase shift network includes at least four serially connected varactors.

6. The apparatus of claim 1 wherein the first and second oscillator circuits and first and second transformers are integrateable.

7. A transceiver, comprising:

an antenna to receive a signal; and a mixer coupled to the antenna and to an oscillator circuit to receive a quadrature oscillator signal, where the oscillator circuit includes, first and second transformers, and first and second oscillators, the first oscillator to receive the signal that is further coupled through the first transformer to the second oscillator and the second oscillator to generate the quadrature oscillator signal that is coupled through the second transformer to the first oscillator.

8. The transceiver of claim 7, wherein the first oscillator further includes a phase shift network of variable reactance devices connected between input terminals.

9. The transceiver of claim 8 wherein the phase shift network in the first oscillator includes at least four serially connected varactors.

10. The transceiver of claim 7 wherein the second oscillator further includes a phase shift network of variable reactance devices connected between output terminals.

11. The transceiver of claim 10 wherein the phase shift network in the second oscillator includes at least four serially connected varactors.

12. A circuit, comprising:

first and second transformers; and first and second oscillators, the first oscillator to provide an in-phase signal at first output terminals that is coupled through the first transformer to the second oscillator and the second oscillator to provide a quadrature signal at second output terminals that is coupled through the second transformer to the first oscillator.

13. The circuit of claim 12, wherein the first transformer includes primary ports coupled to the first output terminals to receive the in-phase signal and secondary ports coupled to the second oscillator.

14. The circuit of claim 12, wherein the second transformer includes primary ports coupled to the second output terminals to receive the quadrature signal and secondary ports coupled to the first oscillator.

15. The circuit of claim 12, further including reactance devices serially connected between the first output terminals of the first oscillator circuit.

16. The circuit of claim 15, wherein the serially connected reactance devices include first, second, third and fourth varactors, where secondary ports of the second transformer are coupled to a common connection of the first and second varactors and to a common connection of the third and fourth varactors.

17. The circuit of claim 12, further including reactance devices serially connected between the second output terminals of the second oscillator.

18. The circuit of claim 17, wherein the serially connected reactance devices includes first, second, third and fourth varactors, where secondary ports of the first transformer are coupled to a common connection of the first and second varactors and to a common connection of the third and fourth varactors.

19. A method comprising:

using a first transformer to couple an in-phase signal provided by a first oscillator to variable reactance devices in a second oscillator;

using a second transformer to couple a quadrature signal provided by the second oscillator to variable reactance devices in the first oscillator; and combining the in-phase signal with a signal phase shifted from the quadrature signal by the variable reactance devices in the second oscillator.

20. The method of claim 19 further comprising:

combining the quadrature signal with a signal phase shifted from the in-phase signal by the variable reactance devices in the first oscillator.

* * * * *

UNITED STATES PATENT AND TRADEMARK OFFICE
CERTIFICATE OF CORRECTION

PATENT NO.    : 6,639,481 B1  
DATED         : October 28, 2003  
INVENTOR(S)   : Ravi et al.

It is certified that error appears in the above-identified patent and that said Letters Patent is hereby corrected as shown below:

<u>Column 4,</u>  
Line 41, after the word "windings" delete "the" and insert -- The --.

Signed and Sealed this

Fourth Day of May, 2004

JON W. DUDAS  
*Acting Director of the United States Patent and Trademark Office*